US010831231B1

(12) United States Patent
Old

(10) Patent No.: US 10,831,231 B1
(45) Date of Patent: Nov. 10, 2020

(54) CIRCUIT FOR AND METHOD OF IMPLEMENTING A POLAR DECODER

(71) Applicant: Xilinx, Inc., San Jose, CA (US)

(72) Inventor: Gordon I. Old, Edinburgh (GB)

(73) Assignee: XILINX, INC., San Jose, CA (US)

( * ) Notice: Subject to any disclaimer, the term of this patent is extended or adjusted under 35 U.S.C. 154(b) by 219 days.

(21) Appl. No.: 15/939,255

(22) Filed: Mar. 28, 2018

(51) Int. Cl.
| G06F 11/00 | (2006.01) |
| G06F 1/03 | (2006.01) |
| G06F 17/16 | (2006.01) |
| G06F 7/50 | (2006.01) |
| G06F 7/52 | (2006.01) |
| G06F 7/544 | (2006.01) |
| H03M 13/37 | (2006.01) |

(52) U.S. Cl.
CPC .............. *G06F 1/0307* (2013.01); *G06F 7/50* (2013.01); *G06F 7/52* (2013.01); *G06F 7/544* (2013.01); *G06F 17/16* (2013.01); *H03M 13/3746* (2013.01)

(58) Field of Classification Search
CPC .......... G06F 1/0307; G06F 17/16; G06F 7/50; G06F 7/544; G06F 7/52; G06F 11/1004; H03M 13/09; H03M 13/3746; H03M 13/3927; G11B 2020/1843
USPC ......................................... 714/752, 758, 794
See application file for complete search history.

(56) References Cited

U.S. PATENT DOCUMENTS

| 5,349,589 | A | * | 9/1994 | Chennakeshu | ....... | H03M 13/35 |
| | | | | | | 341/144 |
| 7,701,260 | B1 | | 4/2010 | Old | | |
| 8,090,755 | B1 | | 1/2012 | Old | | |
| 8,667,044 | B1 | | 3/2014 | Old | | |
| 8,843,541 | B1 | | 9/2014 | Old | | |
| 9,244,885 | B1 | | 1/2016 | Old et al. | | |
| 10,425,107 | B2 | * | 9/2019 | Hamelin | ............. | H03M 13/157 |
| 2015/0026543 | A1 | * | 1/2015 | Li | ......... | H03M 13/45 |
| | | | | | | 714/776 |
| 2016/0013810 | A1 | * | 1/2016 | Gross | .................... | H03M 13/13 |
| | | | | | | 714/776 |
| 2017/0149531 | A1 | * | 5/2017 | Raza | ...................... | H03M 13/37 |
| 2017/0353193 | A1 | * | 12/2017 | Jang | ..................... | H03M 13/13 |
| 2017/0366199 | A1 | * | 12/2017 | Ge | ..................... | G06F 11/1004 |

(Continued)

OTHER PUBLICATIONS

Balatsoukas-Stimming, Alexios et al., "LLR-Based Successive Cancellation List Decoding of Polar Codes", 2014 IEEE International Conference on Acoustic, Speech and Signal Processing (ICASSP), pp. 3931-3935.

(Continued)

*Primary Examiner* — Albert Decady
*Assistant Examiner* — Osman M Alshack
(74) *Attorney, Agent, or Firm* — John J. King; Law Offices of John J. King

(57) ABSTRACT

A circuit for implementing a polar decoder is described. The circuit includes a log-likelihood ratio processing circuit. A path metric update circuit is coupled to receive log-likelihood values for decoded bits from the log-likelihood ratio processing circuit, wherein the path metric circuit generates path metric values for the decoded bits. A partial sum calculation circuit is coupled to receive the path metrics; and a sort and cull circuit is coupled to receive a list of child path, wherein the sort and cull circuit eliminates invalid paths from the list of child paths. A method of implementing a polar decoder is also described.

16 Claims, 5 Drawing Sheets

(56) References Cited

U.S. PATENT DOCUMENTS

| | | |
|---|---|---|
| 2017/0366204 A1* | 12/2017 | Shi ..................... H04L 25/061 |
| 2018/0019766 A1* | 1/2018 | Yang ................... H03M 13/13 |
| 2018/0097580 A1* | 4/2018 | Zhang .................. H03M 13/13 |
| 2018/0191459 A1* | 7/2018 | Ge ....................... H04L 1/0061 |
| 2018/0191465 A1* | 7/2018 | Saber ................... H04L 1/0045 |
| 2019/0165807 A1* | 5/2019 | Wang ................ H03M 13/2927 |

OTHER PUBLICATIONS

Balatsoukas-Stimming, Alexios et al., "On Metric Sorting for Successive Cancellation List Decoding Polar Codes", 4 pgs., 2015 IEEE International Symposium on Circuits and Systems (ISCAS'2015), Jan. 26, 2015.

\* cited by examiner

CIRCUIT FOR AND METHOD OF IMPLEMENTING A POLAR DECODER

FIELD OF THE INVENTION

The present invention relates generally to integrated circuit devices, and in particular to a circuit for and a method of implementing a polar decoder.

BACKGROUND OF THE INVENTION

In a standard Polar Successive Cancellation (SC) decoder, the bits of the decoded codeword are computed in series using an array of processing units (PUs) iteratively, where one pass of the PU array may be required to determine each bit of decoded codeword. In an SC List (SCL) decoder there is a decision point for a bit for example. Unlike an SC decoder, where the decision is to decode the bit according to the sign value of a log-likelihood ratio (LLR) calculated for that bit, each possibility is followed in an SCL decoder. Each of the resulting bit values results in what is called a path. Each of the two child paths inherit all previously decoded bits from the parent path, but each child of a given path differs in the last bit. The decision is determined by the sign of the LLR value from the PU array.

Rather than make a simple decision, both possible values of the bit are followed. Each of the resulting codewords is known as a path, since it describes a decision path which can fork at each decoded bit. Hence the number of tentative codewords (i.e. paths) grows exponentially as 2 to the power of the number of bits that are output. To keep the list of paths to a practical size, once the exponential growth exceeds a chosen value L (i.e. a list number or maximum list size), each path is assigned a path metric value, and the L paths are updated, where the best path metrics are continued, and the others are discarded. However, conventional techniques to update a path list to L paths may require significant circuit resources and may have latency issues.

Accordingly, there is a need for an efficient circuit for and a method of implementing a polar decoder.

SUMMARY OF THE INVENTION

A circuit for implementing a polar decoder is described. The circuit comprises a log-likelihood ratio processing circuit; a path metric update circuit coupled to receive log-likelihood values for decoded bits from the log-likelihood ratio processing circuit, wherein the path metric circuit generates path metric values for the decoded bits; and a sort and cull circuit coupled to receive a list of child paths, wherein the sort and cull circuit eliminates invalid paths from the list of child paths.

A method of implementing a polar decoder is also described. The method comprises implementing a log-likelihood ratio processing circuit; providing log-likelihood values for decoded bits from the log-likelihood ratio processing circuit to a path metric update circuit, wherein the path metric circuit generates path metric values for the decoded bits; receiving a list of child path from a sort and cull circuit, wherein the sort and cull circuit eliminates invalid paths from the list of child paths.

DETAILED DESCRIPTION OF THE DRAWINGS

The circuits for and methods of implementing a polar decoder set forth below improve upon an augmented polar sequential cancellation list (SCL) decoder by combining the elimination of paths by augmentation (e.g. a cyclic redundancy check (CRC) fail or distributed parity fail) and the selection of paths by using a path metric into a single operation, thus reducing latency and resource requirements. According to some implementations, the implied priority of the parity or CRC check versus the path metric sort may be combined by addition of two values, including a value representing a parity or CRC check and the path metric value itself, where the addition of these two values gives a resulting combined value. As long as a weight (P) associated with the pass/fail indication is larger than the maximum possible path metric, the combined value for any CRC/parity passing codeword will be better (i.e. smaller) than the combined value of any failing codeword. Further, for the set of codewords which pass parity or CRC, the combined value can still be used in the sorting process to determine the most likely codeword.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
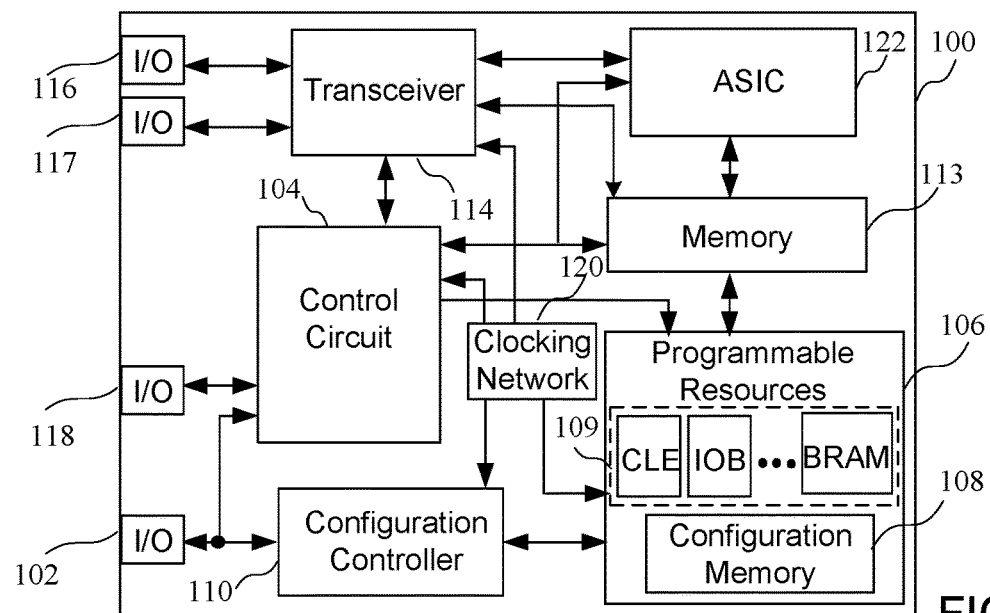
FIG. 1 is a block diagram of an integrated circuit having circuits for implementing a polar decoder.

Turning first to FIG. 1, a block diagram of an integrated circuit device 100 having a transceiver for transmitting and receiving data is shown. In particular, an input/output port 102 is coupled to a control circuit 104 that controls programmable resources 106 having configurable logic elements 109. Configuration data may be provided to the configuration memory 108 by a configuration controller 110. The configuration data enables the operation of the programmable resources 106. A memory 113 may be coupled to the control circuit 104 and the programmable resources 106. A transceiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1.

The circuits for and methods of implementing a polar decoder can be implemented in different types of circuits. According to some implementations, the circuit and methods could be implemented in programmable resources, such as the programmable resources described in FIGS. 5 and 6. According to other implementations, the circuits and methods could be implemented in application specific integrated circuit (ASIC) 122, also known as hard circuits or hardwired circuits. That is, unlike the programmable resources that are configured based upon a downloaded bitstream to configure different blocks of programmable resources as described in FIGS. 5 and 6, ASIC 122 comprises a fixed circuit that provides predetermined functions that are not changed during a configuration, reconfiguration or a partial reconfiguration of the integrated circuit having both fixed circuits and reconfigurable circuits. While the ASIC circuit may have programmable features, the ASIC circuit itself remains during any reconfiguration or partial reconfiguration. While the circuits for and methods of implementing a polar decoder could be implemented in ASIC 122 or in the programmable resources 106, it should be understood that the circuits for and methods of implementing a polar decoder could be implemented in a distributed fashion using both the ASIC 122 and the programmable resources 106.

Figure 2:
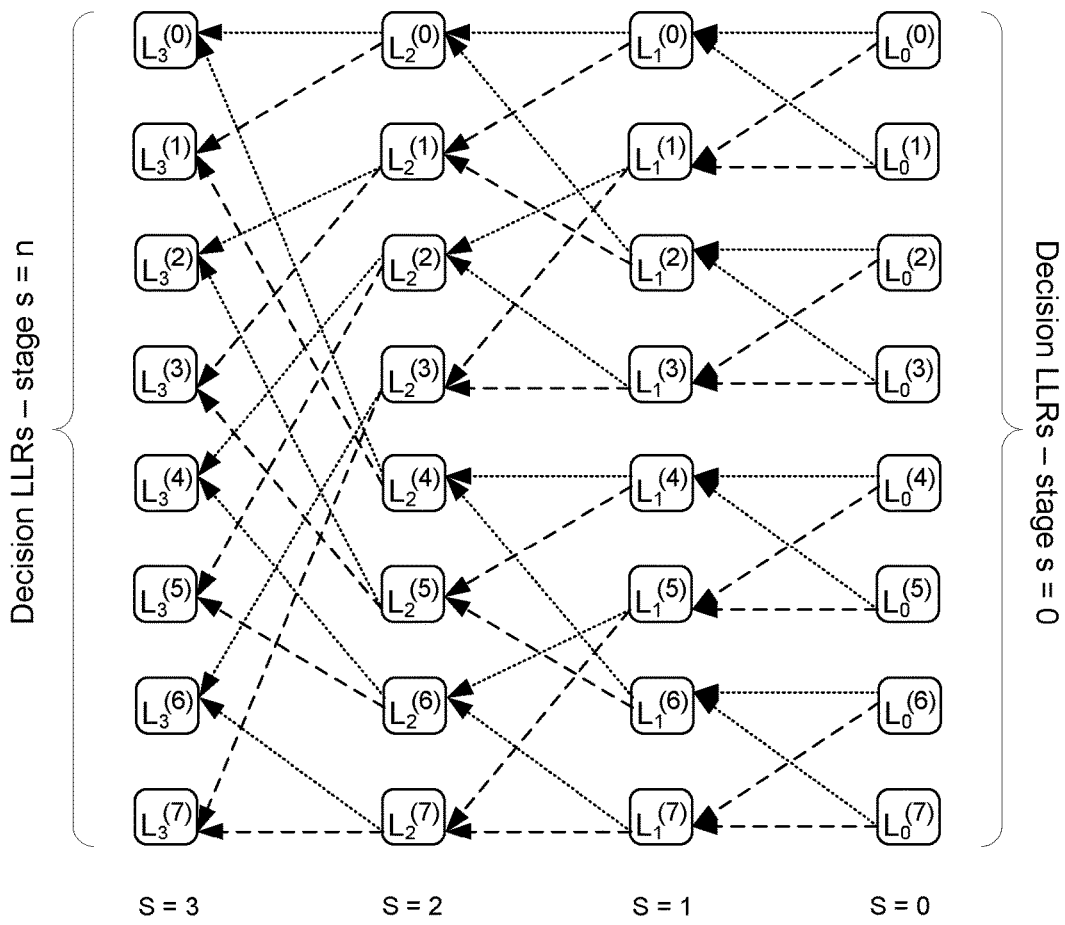
FIG. 2 is a diagram showing log likelihood ratio (LLR) decision paths.
Figure 3:
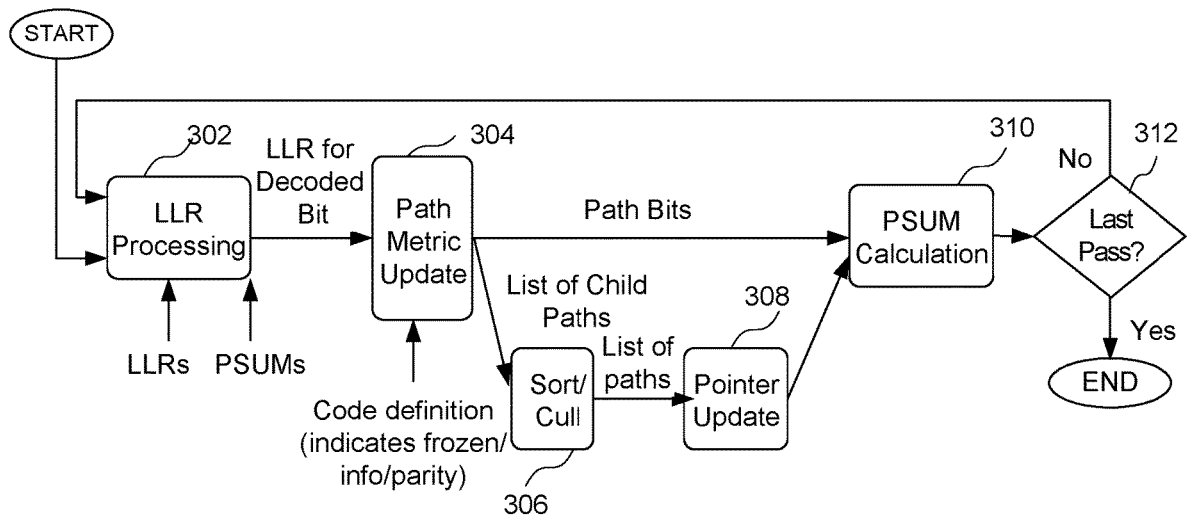
FIG. 3 is a block diagram of a circuit for implementing a polar decoder according to an implementation is shown.

Turning now to FIG. 2, a diagram shows log likelihood ratio (LLR) decision paths. Various stages, shown here as 4 stages from right to left, generated LLR values $L_1$-$L_3$ for each path, shown here as 8 paths extending from top to bottom from a path 0 to a path 7. The example of FIG. 2 is for an 8-bit code word in a radix-2 decoder that decodes 1 bit per pass. An SC decoder, such as the LLR processing circuit 302 of FIG. 3, is used to calculate a pair of likelihoods, $$W_n^{(i)}(y, \hat{u}_0^{i-1}|u_i), u_i \in \{0,1\} \tag{1}$$

Because the decisions are binary, it is sufficient to compute the decision log-likelihood rations (LLRs), $$L_n^{(i)} \triangleq \ln\left(\frac{W_n^{(i)}(y, \hat{u}_0^{i-1} | 0)}{W_n^{(i)}(y, \hat{u}_0^{i-1} | 1)}\right), i \in [N]. \tag{2}$$

The decision LLRs can be calculated according to the following recursions:

$$L_s^{(2i)} = f_-(L_{s-1}^{(2i-[i \bmod 2^{s-1}])}, L_{s-1}^{(2s+2i-[i \bmod 2^{s-1}])}), \tag{3}$$

$$L_s^{(2i+1)} = f_+(L_{s-1}^{(2i-[i \bmod 2^{s-1}])}, L_{s-1}^{(2s+2i-[i \bmod 2^{s-1}])}), \tag{4}$$

For s=n, n−1, . . . 1, where $f_-: R^2 \to R$ and $F_+: R^2 \times \{0,1\} \to R$ are defined as $$f_-(\alpha, \beta) \triangleq \ln\left(\frac{e^{(\alpha+\beta)}+1}{e^{(\alpha)}+e^{(\beta)}}\right), \tag{5}$$

$$f(\alpha, \beta) \triangleq \ln\left(\frac{e^{(\alpha+\beta)}+1}{e^{(\alpha)}+e^{(\beta)}}\right), , \tag{6}$$

respectively. The recursions terminate at s=0 where $$L_0^{(i)} \triangleq \ln\left(\frac{W(yi|0)}{W(yi|1)}\right), \tag{7}$$

are the channel LLRs. The partial sums $u_s^{(i)}$ are computed started from $u_n^{(i)} \triangleq \hat{u}_i$, $\forall i \in [N]$ and setting $$u_{s-1}^{(2i-[i \bmod u2^{(s-1)}])} = u_s^{(2i)} + u_s^{(2i+1)}, \tag{8}$$

$$u_{s-1}^{(2i-[i \bmod u2^{(s-1)}])} = u_s^{(2i+1)}, \tag{9}$$

for s=n, n−1, . . . 1.

Therefore, for each parent path entering the path metric update, 2 child paths will be created if the bit being decoded is an information bit. The LLR value from an LLR processing circuit, as will be described in more detail below, will have a sign and an absolute value. The sign of the LLR indicates to what value an SC decoder (not an SCL decoder) would decode the bit (i.e. a logical 1 or a logical 0). A LLR may be considered as the log of the probability of a 1 divided by the probability of a 0, or as the log of the probability of a 0 divided by the probability of a 0, so the value of the bit indicated by the LLR will either be the same as the LLR sign bit or the logical NOT of the LLR sign bit (depending on which definition of LLR is used). The two children are hypothetical new paths, inherit all the previously decoded bits from their parent, but differ in a new bit added to the end of the path. One child will append 0, the other will append 1. For the child whose appended bit matches the bit value indicated by the sign of the LLR, the path metric is simply that of the parent. For the other child, the path metric value is the value from the parent plus the absolute value of the LLR. That is, the path metric is a low value for a path which is most likely and a higher value for a path which is less likely to be correct.

It should be noted that path metrics are penalty values. Therefore, for a bit which the decoder knows is frozen (i.e. a known 0, which is known based upon the code definition and the index of the bit being decoded), it is not necessary to create a child path with 1 appended, since it is known that that would be wrong. Rather, a single child path is created from the parent, a 0 is appended, and the same test and penalty is applied as before (i.e. if the LLR sign suggests a 1, then the absolute value of the LLR is added to the parent path metric and assigned to the child, otherwise the parent path metric value is just passed to the child).

Turning now to FIG. 3, a block diagram of a system for implementing a polar decoder according to an implementation is shown. An LLR processing circuit 302 is coupled to receive LLRs and PSUMs, and generate LLRs for decoded bits that are provided to receive a codeword, represented by the START designation and provide to an input of the LLR processing circuit, a path metric update circuit 304. The LLR processing circuit 302 may be implemented as described above in reference to FIG. 2. The LLR processing circuit operates on input LLRs and on PSUMS of previously decoded bits to give an LLR value for each successive bit in the codeword. In a first pass, an LLR will be created for bit 0 which allows bit 0 to be determined. This bit 0 value is used to create a PSUM value or vector which is part of the calculation of the LLR for the second bit. By way of example, an 8-bit code word as described in reference to FIG. 3, the LLR processing circuit could perform 8 passes of the processing as described in FIG. 3 to generate path bits (i.e. the decoded bits of the code word), where updated LLRs and PSUMs would be provided to the LLR processing circuit after each pass. After the code word is decoded (i.e.

after the 8 passes of the data through the LLR processing circuit 302 and the path metric update circuit 304, a new codeword is provided at the start input of the LLR processing circuit 302.

A code definition, which may indicate whether a bit is frozen, represents an information bit, or is a parity bit, is provided to the path metric update circuit 304, which generates a list of child paths and path bits. A sort and cull circuit 306 performs a sort and cull operation to generate a list of paths that is provided to a pointer update circuit 308. The path bits, which are the decoded bits themselves, and updated pointer information are provided to a partial sum (PSUM) calculation circuit 310 to generate updated PSUM values. It should be noted that if a bit is an information bit, child paths are created, and therefore a sort and cull process is required. However, for a frozen bit (i.e. a decision of 0), no additional paths are generated. The cull and sort circuit 306 outputs a list of path metrics and the indices of the position in the input list that each output came from. For example, if a list of path metrics was 10, 4, 5, and 7, the output would be 4, 5, 7, and 10 with indices 1, 2, 3, 0. It is then determined at a block 312 if the last pass of the decoding operation has been performed, it is not necessary to form any more PSUM calculations, but rather the final path metrics are provided by the path metric update block 304. If so, the process is ended. If not, the LLR processing is continued to be performed by the LLR processing block 302 based upon current LLRs and PSUMs. The determination of whether a last pass of the decoding is reached at the block 312 could be made by a processing circuit associated with the other circuit elements of FIG. 3, such as processor block 510 of FIG. 5 for example. By way of example, each circuit element 302-310 could be implemented in one or more CLE elements described in FIG. 6 or in the ASIC circuit.

The path metric value is updated by path metric update circuit 304 each time a bit decision is made and provided to the sort and cull circuit 306 as a list of child paths. The function for the path metric for each path is an addition of two values. The first value is simply the present value of the path metric for the path. The second value may be a function of the bit decision and the LLR value which was used for that bit decision. This second value may be zero for the path where sign of the LLR agrees with the bit decision. For the other path, the second value is the absolute value of the LLR. For example, if an LLR value is 0.3 and a path has a path metric of 0.2, then at the decision point two new paths are created. The first of these two paths follows a decision of '0' for the bit. LLRs can be defined such that a positive value indicates that a 0 is more likely or that a 1 is more likely, but for this example, a positive value indicates a 0. The first path decision therefore agrees with the LLR so its new path metric is 0.2 (simply the value it inherited from its parent path plus 0).

Because the selection of the first path is arbitrary, the first path could follow a '1'. That is, a bit can have one of two possible values, 0 and 1. The two paths created follow each of these 2 values. Each path is then given a path metric value which is the path metric inherited by the parent, plus a value determined by whether the bit value agrees with the LLR sign or not. Hence, one of the two paths will be penalized in the sense that it's path metric will become bigger than its parent. The other (i.e. the one where the bit value agrees with the LLR) is not penalized so it will have the path metric inherited from the parent.

If the second path follows the decision of a '1' for the bit, which disagrees with the LLR, the path metric for this second path is 0.5 (i.e. 0.2 from the parent path plus 0.3 from the absolute value of the LLR). It should be noted that since path metrics increase to indicate low relative likelihood, path metrics are in effect 'penalty' points, so a low value is a good (i.e. likely) path. This set of path metrics is then sorted. The best (i.e. lowest) path metric L paths are kept and passed to the LLR processing for the determination of the next bit.

The path metric calculation may be determined by:

$$\phi(\mu \cdot \lambda, u) \triangleq \begin{cases} 0 \text{ if } x < 0 \\ x \text{ if } x \geq 0 \end{cases}. \tag{10}$$

For the 2 child paths created per parent path at each information bit, the parent path metric for the path which agrees with the LLR sign (i.e. what an SC decoder would do) is simply inherited. For the other path, the parent path metric is inherited, and the path metric for that child is additionally penalized with the absolute value of the LLR. By way of example, a large absolute value of LLR value indicates high confidence in that LLR sign, hence the high penalty for disagreement.

To implement sort and cull, the path metric may be calculated and then used as the basis on which to decide which L paths should survive from a list of 2L child paths. That is, the sort and cull circuit selects L paths from a larger list (e.g. 2L for a decoder which decodes 1 bit per pass, 4L for 2 bits per pass, 16L for 4 bits per pass). A pointer update may be implemented using a copy-on-write mechanism for example for storing path data. Alternatively, a sequential implementation of the computations could also be used, where each path has its own virtual internal LLR memory, the contents of which are physically spread across all of the LLR memory banks. The translation from virtual memory to physical memory may be performed using a small pointer memory. When a path f needs to be duplicated, as with the partial sum memory, the contents of row f of the pointer memory are copied to some row corresponding to a discarded path through the use of L×L crossbars for example.

A PSUM calculation performed by the PSUM calculation block 310 is a sequence of calculations, where a summation process continues until all iterations of the summation are completes after a last pass of the decoder. By way of example, PSUMs are an XOR of previously decoded bits which are used in subsequent passes of LLR processing. The PSUM calculation circuit enables determining additional LLR values in subsequent passes of the circuit for determining the decoded bits. As data passes through the trellis, a first function (f) is used for determining an upper value and a second function (G) is used for determining a lower value. The PSUM calculation circuit attempts to determine the upper value. The calculation of PSUMS can be either a function of all previously determined path bits, but since this can be a significant number of bits (e.g. 1024), a typical implementation takes only recently determined bits so as to update a stored array of PSUMS (i.e. the calculation of PSUMs is incremental). That is, the PSUM calculation circuit would store a running total, so that on each pass it would only be necessary to add the new number. By storing intermediate values in the trellis, it is possible to perform fewer calculation to determine a final decoded value.

The value P is a penalty value of an invalid path. This value may be added as described, or logically OR'd to the inherited parent path metric (PM). Both methods are viable because in either case the resulting value P or P+PM is still greater than any possible value of PM alone because arithmetic operations to create PM alone saturate at a value less than P. For example, an implementation of an LLR may include 8 bits consisting of 1 sign bit and 7 bits describing the magnitude. Path metrics may be 11-bit unsigned values. P may be a value 1024. Path metric additions are followed by a saturation operation which ensures the maximum value due to addition of path metrics is limited to 1023. As a result, is it sufficient to logically OR the P value as this will result in a value of 1024 or greater, and therefore guaranteed to be greater than 1023. It would also be sufficient to simply ignore the incoming PM value if P is to be added or OR'd, as this will result in a value of 1024 which is also guaranteed greater than 1023.

To improve the error rate of such a list decoder, the selection process can be augmented in several ways. Each of these ways may employ incorporating augmentation information (e.g. cyclic redundancy check (CRC) or parity information) into the decoded information bits. Prior knowledge of where these parity or CRC bits allows the decoder to perform a parity or CRC operation on each tentative codeword to determine if that codeword complies with the CRC or parity check. A parity check is used to generally describe when paths, which do not pass parity or CRC for example, are eliminated, and then the survivors are sorted according to path metric. That is, a parity check is any type of check of received used to determine when a path could not be a valid path.

Since any number from 0 to L of the paths may pass this first check, the number of codewords passing to the next iteration may be any number from 0 to L. This introduces a dynamic number (i.e. the number of surviving paths) into the control of codewords for each iteration.

It should be noted that the implied priority of the parity/CRC check versus the path metric sort may be combined by addition of two values. The first value is the path metric value and the second value is an augmented value (i.e. CRC or parity value), where the addition of these two values gives a resulting combined value. As long as the weight (P) associated with the pass/fail indication or the CRC or parity value is larger than the maximum possible path metric, then it follows that the combined value for any CRC/parity passing codeword will be better (i.e. smaller) than the combined value of any failing codeword. It further follows that for the set of codewords which pass parity or CRC, the combined value can still be used in the sorting process to determine the most likely codeword.

Hence, it is only necessary to use the combined value for each codeword in a sort mechanism to order codewords by CRC/parity pass as a first priority and by path metric as a second priority. In other words, both selections can be performed in a single sort operation. By combining the validity or invalidity of a path with the path metric, the soft/cull mechanism can be used to perform the path elimination function of invalid paths without incurring the cost of an additional invalid path removal circuit and the additional cost of handling a dynamic list size. It should be noted that invalid paths may survive a small number of passes after being declared invalid, but they will eventually be culled in favor of child paths from valid paths. That is, invalid paths are eliminated before eliminating the worst valid paths. For simplicity, the addition operation can be simplified by ensuring that P>=R where R is one more that the maximum path metric then rounded up to the next power of 2. For example, if the maximum path metric is 7, then P=8. The addition can then be a simple concatenation operation. In a variation, a value I' can be any multiple of the first possible value of P.

It should be noted that this invention is not free compared to a SCL calculation and sort. While the path metric used in this invention is necessarily at least one bit wider than that of a standard SCL, the selection of the child paths is performed with reduced circuit requirements and improved latency.

It should be noted that the value of bit 'P' must persist in the path metric as the SCL algorithm proceeds to subsequent bits of decode. That is, if a given path has failed the CRC or parity check, then that failure indication must pass to all child paths. Therefore, the value of P may be a logical OR operation of the CRC/parity pass at any given bit and the existing value of P of the parent path. In other words, if a parent path has previously failed CRC or parity check, then both child paths created at the bit decision point must inherit that failure value regardless of whether they pass parity/CRC at this bit index.

Therefore, the function to create the child path metric from the parent is performed in two parts. For the calculation of P, the child path's P will be parent's P value, logically OR'd with O (pass) or P (fail) for the parity/CRC check at this bit decision. This penalty applies to one of the 2 paths created when the bit in question is an information bit. It also applies if the bit in question is frozen, meaning a bit decision of '0'. In the case of frozen bits, no new paths are created, so each child path is a copy of its parent with '0' (the frozen bit) appended. It should be noted that care must be taken to ensure that the path metric, which is an addition, does not grow such that the value carries into the bit position held by P. Either the bit field for path metric must be chosen to ensure overflow is not possible, or saturation must be employed.

According to one implementation, the path metric may be allowed to overflow into the bit position held by the parity/CRC check indication. That is, a because large path metrics indicate unlikely paths, a large path metric value can be taken as equivalent to a parity/CRC fail.

It should be noted that paths which have failed the parity/CRC check can survive the sort and cull process to be included in the list for the next pass of processing. While this may lead to a power increase of unnecessary calculations compared to the situation where all paths which fail the parity/CRC check are not culled, the bit which indicates whether or not the path passed parity/CRC may be used to disable processing for that path.

Further, since any path which failed parity/CRC may survive the cull process at the end of a sort, any child processes from this failed path will inherit the fail, and will be replaced by passing paths in a small number of passes of sort/cull as those passing paths multiply. It should be noted that each of the circuit elements of FIG. 3 could be implemented in one or more CLEs and/or other circuit elements as described below in FIGS. 5 and 6, where the CLEs and/or other circuit elements could be programmed to implement the operation of the various circuits such as a logical "OR" or an addition function as described above. Alternatively, the circuit elements of FIG. 3 could be implemented in hardened circuits, such as circuits of ASIC 122. It should be further noted that higher radix decoders for implementing the various methods and circuits for implementing a polar decoder could be used, where more than one bit is decoded per pass of the PU processing and more child paths are produced per parent path. Implementations having 2 child paths per bit are provided by way of example.

Figure 4:
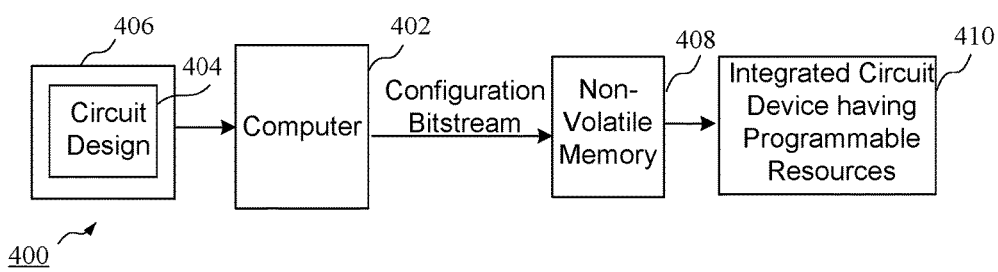
FIG. 4 is a block diagram of a system for programming a device having programmable resources.

Turning now to FIG. 4, a block diagram of a system 400 for programming a device having programmable resources according to an implementation is shown. In particular, a computer 402 is coupled to receive a circuit design 404 from a memory 406, and generates a configuration bitstream that is stored in the non-volatile memory 406. As will be described in more detail below, the circuit design may be a high-level design, such as a circuit design defined in a hardware description language (HDL). Also, the computer may be configured to run software that generates a configuration bitstream that is stored in the non-volatile memory 408 and provided to an integrated circuit 410, which may be a programmable integrated circuit, such as the integrated circuit described below in FIG. 5. As will be described in more detail below, bit of the configuration bitstream are used to configure programmable resources of the integrated circuit.

Figure 5:
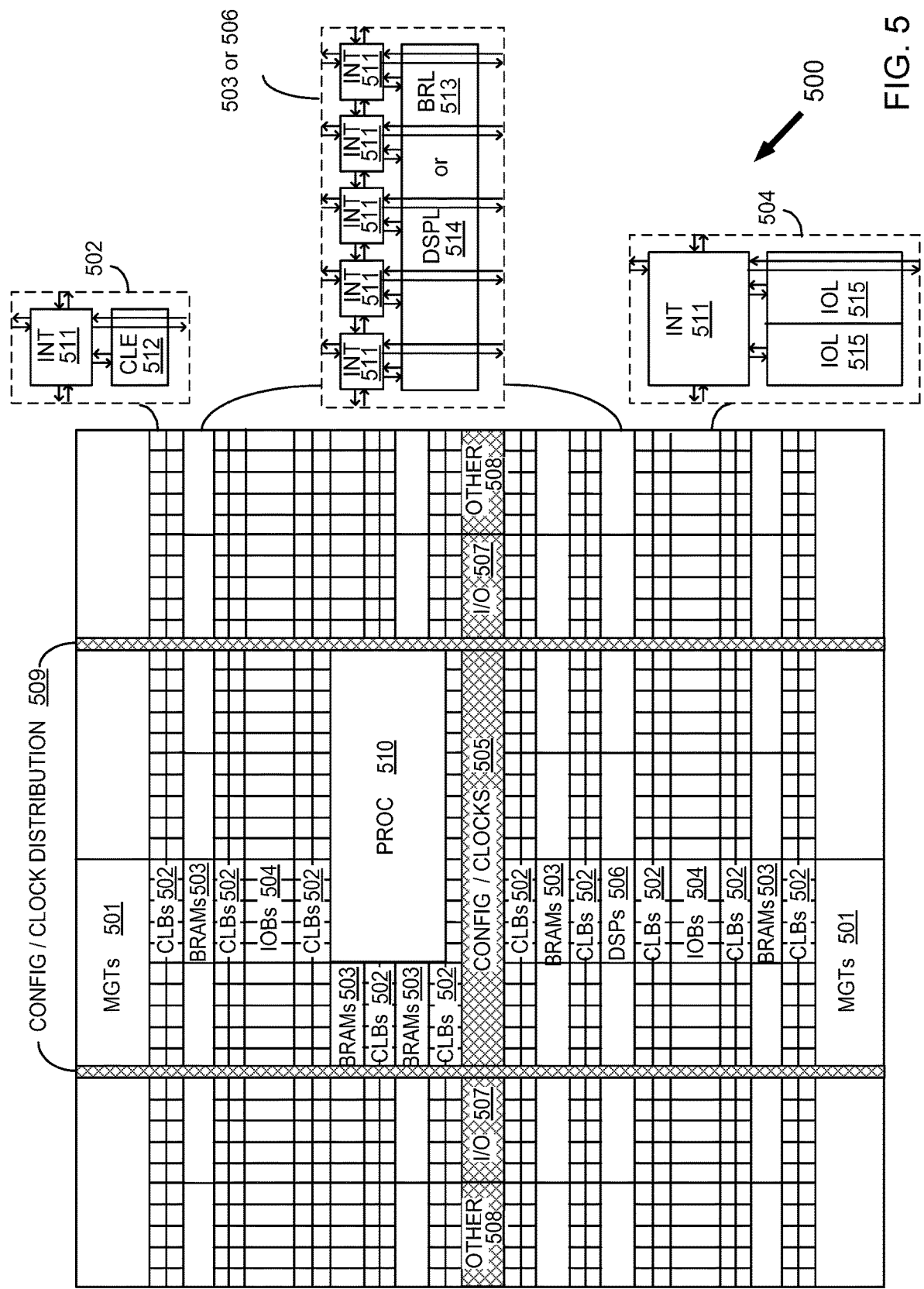
FIG. 5 is a block diagram of a device having programmable resources that may implement the circuits of FIGS. 1-3.

Turning now to FIG. 5, a block diagram of a device having programmable resources including the circuits of FIGS. 1-3 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 5 comprises an FPGA architecture 500 having a large number of different programmable tiles including multi-gigabit transceivers (MGTs) 501, CLBs 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507 (e.g., configuration ports and clock ports), and other programmable logic 508 such as digital clock managers, analog-to-digital converters, system monitoring logic, and so forth. Some FPGAs also include dedicated processor blocks (PROC) 510, which may be used to implement a software application, for example.

In some FPGAs, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA. The programmable interconnect element 511 also includes the connections to and from the programmable logic element within the same tile, as shown by the examples included at the top of FIG. 5.

For example, a CLB 502 may include a configurable logic element (CLE) 512 that may be programmed to implement user logic plus a single programmable interconnect element 511. A BRAM 503 may include a BRAM logic element (BRL) 513 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 506 may include a DSP logic element (DSPL) 514 in addition to an appropriate number of programmable interconnect elements. An IOB 504 may include, for example, two instances of an input/output logic element (IOL) 515 in addition to one instance of the programmable interconnect element 511. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 509 extending from this column are used to distribute the clocks and configuration signals across the breadth of the FPGA. Some FPGAs utilizing the architecture illustrated in FIG. 5 include additional logic blocks that disrupt the regular columnar structure making up a large part of the FPGA. The additional logic blocks may be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear in order to facilitate the efficient implementation of user logic. While the implementation of FIG. 5 relates to an integrated circuit having programmable resources, it should be understood that the circuits and methods set forth above could be implemented in any type of ASIC, or in the ASIC 122, or in a combination of programmable resources, such as CLEs and BRAMS for example, and the ASIC 122.

Figure 6:
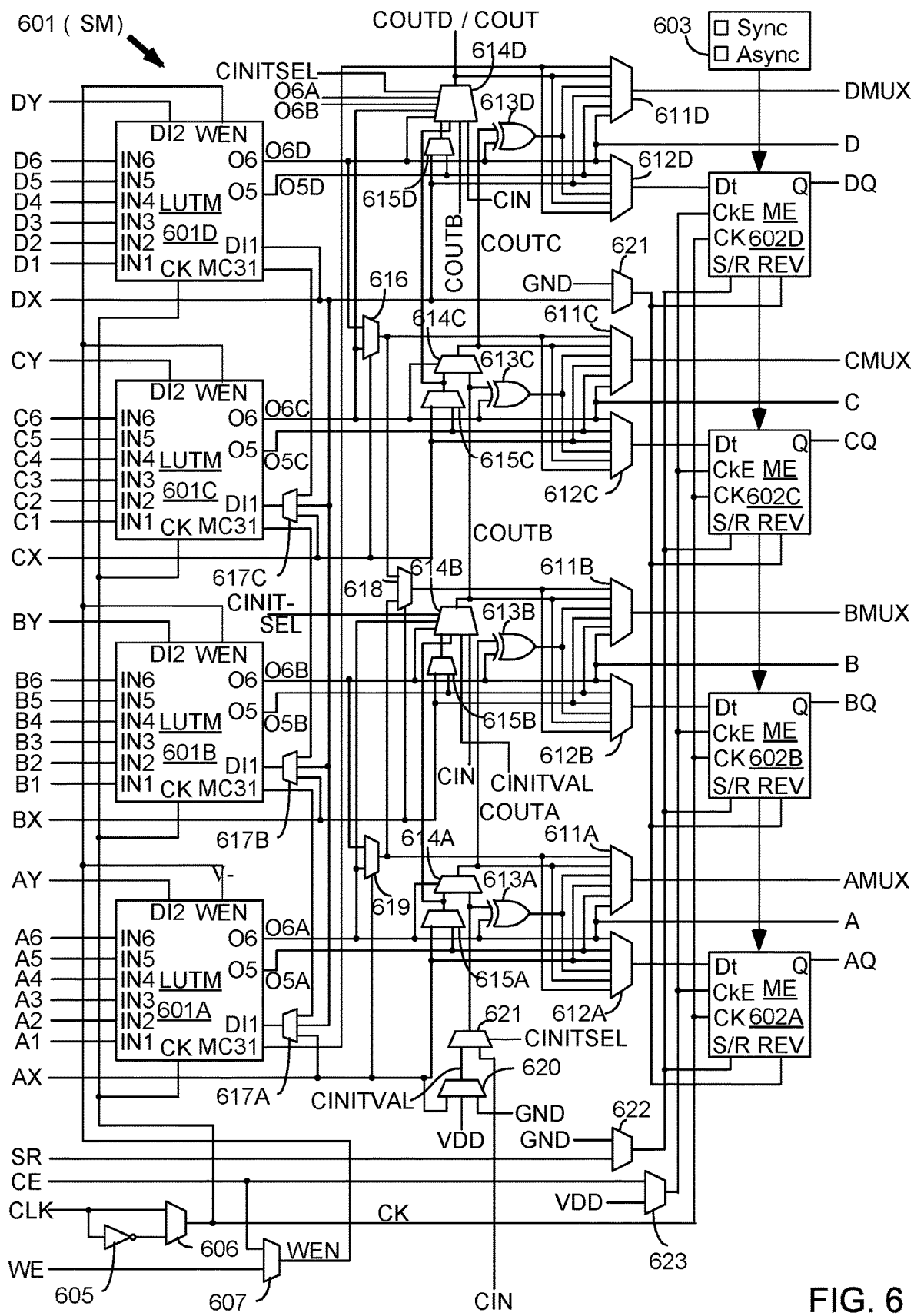
FIG. 6 is a block diagram of a configurable logic element of the device of FIG. 5.

Turning now to FIG. 6, block diagram of a configurable logic element of the device of FIG. 5 is shown. In particular, FIG. 6 illustrates in simplified form a configurable logic element of a configuration logic block 502 of FIG. 5. In the implementation of FIG. 6, slice M 601 includes four lookup tables (LUTMs) 601A-601D, each driven by six LUT data input terminals A1-A6, B1-B6, C1-C6, and D1-D6 and each providing two LUT output signals O5 and O6. The O6 output terminals from LUTs 601A-601D drive slice output terminals A-D, respectively. The LUT data input signals are supplied by the FPGA interconnect structure via input multiplexers, which may be implemented by programmable interconnect element 611, and the LUT output signals are also supplied to the interconnect structure. Slice M also includes: output select multiplexers 611A-611D driving output terminals AMUX-DMUX; multiplexers 612A-612D driving the data input terminals of memory elements 602A-602D; combinational multiplexers 616, 618, and 619; bounce multiplexer circuits 622-623; a circuit represented by inverter 605 and multiplexer 606 (which together provide an optional inversion on the input clock path); and carry logic having multiplexers 614A-614D, 615A-615D, 620-621 and exclusive OR gates 613A-613D. All of these elements are coupled together as shown in FIG. 6. Where select inputs are not shown for the multiplexers illustrated in FIG. 6, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 6 for clarity, as well as from other selected figures herein.

In the pictured implementation, each memory element 602A-602D may be programmed to function as a synchronous or asynchronous flip-flop or latch. The selection between synchronous and asynchronous functionality is made for all four memory elements in a slice by programming Sync/Asynch selection circuit 603. When a memory element is programmed so that the S/R (set/reset) input signal provides a set function, the REV input terminal provides the reset function. When the memory element is programmed so that the S/R input signal provides a reset function, the REV input terminal provides the set function. Memory elements 602A-602D are clocked by a clock signal CK, which may be provided by a global clock network or by the interconnect structure, for example. Such programmable memory elements are well known in the art of FPGA design. Each memory element 602A-602D provides a registered output signal AQ-DQ to the interconnect structure. Because each LUT 601A-601D provides two output signals, O5 and O6, the LUT may be configured to function as two 5-input LUTs with five shared input signals (IN1-IN5), or as one 6-input LUT having input signals IN1-IN6.

In the implementation of FIG. 6, each LUTM 601A-601D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal D11 (via multiplexers 617A-617C for LUTs 601A-601C), or to the two 32-bit RAMs via input terminals D11 and D12. RAM write operations in the LUT RAMs are controlled by clock signal CK from multiplexer 606 and by write enable signal WEN from multiplexer 607, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals D11 and D12. The 16-bit and 32-bit shift out signals may be provided through the LUT output terminals, and the 32-bit shift out signal may also be provided more directly via LUT output terminal MC31. The 32-bit shift out signal MC31 of LUT 601A may also be provided to the general interconnect structure for shift register chaining, via output select multiplexer 611D and CLE output terminal DMUX. Accordingly, the circuits and methods set forth above may be implemented in a device such as the devices of FIGS. 5 and 6, or any other suitable device.

Figure 7:
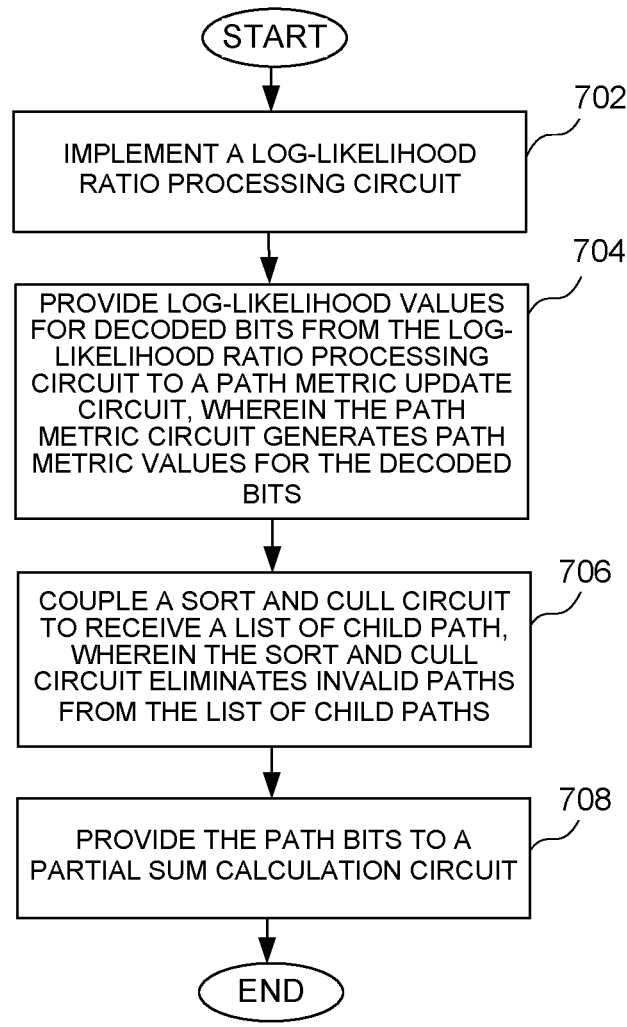
FIG. 7 is a flow diagram showing a method of implementing a polar decoder.

Turning now to FIG. 7, a flow diagram shows a method of implementing a polar decoder. A log-likelihood ratio processing circuit is implemented at a block 702. The log-likelihood ratio processing circuit could be implemented as LLR processing circuit 302 as described above in reference to FIG. 3. Log-likelihood values for decoded bits from the log-likelihood ratio processing circuit are provided to a path metric update circuit, such as path metric update circuit 304, wherein the path metric circuit generates path metric values for the decoded bits at a block 704. A sort and cull circuit is coupled to receive a list of child path, wherein the sort and cull circuit eliminates invalid paths from the list of child paths at a block 706. The sort and cull circuit could be implemented as sort and cull circuit 306 as described above.

It should be noted that the sort and cull circuit is only necessary after information bits, and not for frozen bits. Further, by combining the validity or invalidity of a path with the path metric, the soft/cull mechanism can be used to perform the path elimination function of invalid paths without incurring the cost of an additional invalid path removal circuit and the additional cost of handling a dynamic list size. The sort and cull circuit selects the best L paths from the list of child paths, which may include invalid paths. That is, invalid paths may survive a small number of passes after being declared invalid, but they will eventually be culled in favor of child paths from valid paths, eliminating the need to determine the validity of a path and eliminate invalid paths before providing a list of child paths to the sort and cull circuit 308. The path bits are provided to a partial sum calculation circuit at a block 708. The partial sum calculation circuit could be any type of partial sum calculation circuit, such as the PSUM calculation circuit 310.

The method of FIG. 7 may be implemented using the circuits of FIGS. 1-6 as described, or using some other suitable circuits. While specific elements of the method are described, it should be understood that additional elements of the method, or additional details related to the elements, could be implemented according to the disclosure of FIGS. 1-6.

It can therefore be appreciated that new circuits for and methods of implementing a polar decoder have been described. It will be appreciated by those skilled in the art that numerous alternatives and equivalents will be seen to exist that incorporate the disclosed invention. As a result, the invention is not to be limited by the foregoing implementations, but only by the following claims.

What we claims is:

1. A circuit for implementing a polar decoder, the circuit comprising:
   a log-likelihood ratio processing circuit;
   a path metric update circuit coupled to the log-likelihood ratio processing circuit, wherein the path metric update circuit is configured to receive log-likelihood values for decoded bits from the log-likelihood ratio processing circuit, wherein the path metric update circuit generates path metric values for the decoded bits and generates parity checks for the path metric values, each of the path metric values comprising a value representing a parity check of a path and a path metric for the path; and
   a sort and cull circuit coupled to the path metric update circuit, wherein the sort and cull circuit is configured to receive a list of child paths, wherein the sort and cull circuit eliminates invalid paths from the list of child paths based upon the values representing the parity checks of the child paths;

wherein child paths that receive a failure indication in the values representing the parity checks of the child paths are replaced with passing paths in a next decoding stage; and wherein the sort and cull circuit combines the elimination of invalid paths based upon the values representing the parity checks and a selection of paths based upon the path metric values into a single operation.

2. The circuit of claim 1, wherein the sort and cull circuit establishes a priority of a parity check and a path metric sort determined by an addition of a path metric value and a binary value which indicates a success or failure of a parity check.

3. The circuit of claim 2, wherein the addition of the path metric value and the binary value is a concatenation of the binary value which indicates a success or failure of the parity check and the path metric value.

4. The circuit of claim 1, wherein the sort and cull circuit eliminates invalid paths before eliminating valid paths of the list of child paths, wherein the eliminated valid paths of the list of child paths comprise worst valid paths of the list of child paths.

5. The circuit of claim 1, wherein the sort and cull circuit uses a parity check as a first priority for determining a list of paths and path metrics as a second priority for determining the list of paths.

6. The circuit of claim 1, wherein the sort and cull circuit passes a parity check failure of a parent path to all child paths of the parent path.

7. The circuit of claim 6, wherein child paths receiving a parity check failure from a parent path are replaced by passing paths in a next decoding stage.

8. The circuit of claim 1, wherein the path metric update circuit creates no new paths in the case of a parent path having a frozen bit, and each child path of a parent path having a frozen bit is a copy of its parent with the frozen bit appended.

9. A method of implementing a polar decoder, the method comprising:

implementing a log-likelihood ratio processing circuit;

providing log-likelihood values for decoded bits from the log-likelihood ratio processing circuit to a path metric update circuit, wherein the path metric update circuit generates path metric values for the decoded bits and generates parity checks for the path metric values, each of the path metric values comprising a value representing a parity check of a path and a path metric for the path;

receiving a list of child paths at a sort and cull circuit, wherein the sort and cull circuit eliminates invalid paths from the list of child paths based upon the values representing the parity checks of the child paths;

replacing child paths that receive a failure indication in the values representing the parity checks of the child paths with passing paths in a next decoding stage; and combining, by the sort and cull circuit, the elimination of invalid paths based upon the values representing the parity checks and a selection of paths based upon the path metric values into a single operation.

10. The method of claim 9, further comprising establishing, by the sort and cull circuit, a priority of a parity check and a path metric sort determined by an addition of a path metric value and a binary value which indicates a success or failure of a parity check.

11. The method of claim 10, wherein the addition of the path metric value and the binary value is a concatenation of the binary value which indicates a success or failure of the parity check and the path metric value.

12. The method of claim 9, further comprising, eliminating, by the sort and cull circuit, invalid paths before eliminating valid paths of the list of child paths, wherein the eliminated valid paths of the list of child paths comprise worst valid paths of the list of child paths.

13. The method of claim 9, further comprising using a parity check as a first priority for determining a list of paths and path metrics as a second priority for determining the list of paths.

14. The method of claim 9, further comprising passing a parity check failure of a parent path to all child paths of the parent path.

15. The method of claim 14, further comprising replacing child paths receiving a parity check failure from a parent path with passing paths in a next decoding stage.

16. The method of claim 9, further comprising creating no new paths in the case of frozen bits, and each child path of a parent path having a frozen bit is a copy of its parent with the frozen bit appended.

* * * * *